United States Patent [19]

Carlson et al.

[11] Patent Number: 4,930,045
[45] Date of Patent: May 29, 1990

[54] HIGH POWER, HIGH TEMPERATURE DISASSEMBLABLE CERAMIC CAPACITOR MOUNT

[75] Inventors: William E. Carlson, Rockford; Mark W. Metzler, Davis, both of Ill.

[73] Assignee: Sundstrand Corporation, Rockford, Ill.

[21] Appl. No.: 428,272

[22] Filed: Oct. 26, 1989

[51] Int. Cl.⁵ .......................... H05K 7/20; H01B 7/00
[52] U.S. Cl. .................................. 361/329; 174/72 B; 361/383
[58] Field of Search ........................... 361/328–330, 361/400, 417, 380–385, 306, 321; 174/72 B

[56] References Cited

U.S. PATENT DOCUMENTS

| | | | |
|---|---|---|---|
| 3,187,226 | 6/1965 | Kates | 361/417 X |
| 3,383,458 | 5/1968 | Raskhodoff et al. | 174/72 B |
| 3,566,190 | 2/1971 | Huebner et al. | 361/383 |
| 4,006,388 | 2/1977 | Bartholomew | 361/383 |
| 4,037,270 | 7/1977 | Ahmann et al. | 361/385 |
| 4,356,532 | 10/1982 | Donaher et al. | 361/329 X |
| 4,401,843 | 8/1983 | Harper et al. | 174/72 |
| 4,451,694 | 5/1984 | Harper et al. | 174/72 |
| 4,517,406 | 5/1985 | Erdle | 174/72 B |
| 4,599,486 | 7/1986 | Herrandez | 174/72 |

OTHER PUBLICATIONS

U.S. Application 397677, Zodtner, 361-321 published 5/1943.

Primary Examiner—Donald A. Griffin
Attorney, Agent, or Firm—David H. Hitt

[57] ABSTRACT

A disassemblable capacitor mount for large, high power, high temperature ceramic capacitors is disclosed. The capacitor mount allows the capacitors to be mechanically secured to a printed circuit board or other planar surface and allows for good electrical contact to be made with the capacitors to handle high power. The capacitor mount comprises a pair of substantially parallel, spaced-apart conductors, the conductors provided with a plurality of corresponding spaced-apart lateral slots on facing planar sides thereof. A plurality of compressible contactors are disposed within the slots. A plurality of capacitors having opposed electrode ends are disposed between the conductors, the ends positioned within the slots and contacting the contactors. Finally, a rigid mechanism removably fixes the conductors to a planar surface. The conductors compressingly urge against the capacitors. The disassemblable capacitor mount provides a stress relieving, thermal expansion absorbing and heat dissipating structure for securing the capacitors to the planar surface. Specifically, the capacitor mount has a structure which allows faulty capacitors to be readily removed from the capacitor mount and replaced.

17 Claims, 2 Drawing Sheets

HIGH POWER, HIGH TEMPERATURE DISASSEMBLABLE CERAMIC CAPACITOR MOUNT

TECHNICAL FIELD

This invention relates to a high power, high temperature disassemblable ceramic capacitor mount of the type used to mechanically secure a plurality of ceramic capacitors to the surface of a printed circuit board or other planar surface, the mount also providing electrical connections to the capacitors and spaces between the capacitors for cooling. In particular, the mount can be disassembled to permit easy replacement or substitution of the ceramic capacitors.

BACKGROUND ART

Variable speed constant frequency ("VSCF") systems and other high power airborne applications require the use of high voltage, high frequency, high capacitance capacitors in small packages to filter current produced by these systems. Ceramic capacitors offer several advantages over other types when used in conjunction with power electronics. In fact, large multilayered ceramic capacitor assemblies can be used to replace several smaller capacitors wired in parallel.

These ceramic capacitor assemblies are approximately rectangular in shape, having a width and heighth typically in excess of an inch and a depth of somewhat less than an inch. These capacitor assemblies are provided with electrode coatings on opposite faces where electrical contact may be made to capacitor plates within the capacitor. Apart from electrode ends, the body of the typical ceramic capacitor assembly is coated with a dielectric material.

Mounting of these large ceramic capacitor assemblies (hereinafter referred to as "capacitors") to a printed circuit board, chassis wall or other planar surface has proven to be a difficult task in the past. Because of their size, the capacitors must be mechanically fixed to the planar surface. Furthermore, due to the high quantity of power passing through the capacitors, significant electrical contact must be made to the capacitor electrodes.

Mounting was done typically in two steps. First, the body of the capacitor was usually mechanically fixed to the planar surface by cement or by pooling solder on the planar surface and pressing the dielectric body of the capacitor into the solder to enable the solder to hold the capacitor. Second, electrical contact was accomplished by bringing electrical leads from the planar surface to the electrodes on the capacitor. Accordingly, mounting of large ceramic capacitors was by trial and error and had to be repeated individually for each capacitor to be mounted.

Apart from an unsightly mess on the printed circuit board and a constant problem arising from mounting solder creating undesired electrical paths on the board, a further problem encountered with the prior mounting methods was that significant thermal expansion of the capacitor would occur during operation. Accordingly, extreme stress would be imparted to the cement or solder holding the body of the capacitor to the planar surface. Sometimes the cement or solder would loosen, allowing the capacitor to separate from the planar surface. At other times, the cement or solder would not allow the capacitor to expand, causing catastrophic failure.

Further, the old mounting method failed to provide a means by which the capacitors could be cooled during operation, thereby relieving stress on the capacitors and lengthening their lives.

Finally, the old mounting method failed to provide a simple means by which capacitors could be replaced following failure. Under the old method, the solder or cement holding the capacitor in place would have to be melted or dissolved and the new capacitor would then have to be installed in the same manner as the replaced capacitor.

For years, low power applications have demanded mounting of capacitors to printed circuit boards. However, low power applications do not have to address the mechanical mounting, power handling, thermal expansion or replacement problems encountered in high power applications.

Following are patents which address capacitor mounting for low power applications.

U.S. Pat. No. 4,401,843 ("843"), which issued on Aug. 30, 1983 to Harper et al., is directed to various structures for, and methods of constructing, miniaturized high capacitance bus bars. The bus bars incorporate discrete high capacitive elements between a pair of bus bar conductors. Alternative arrangements are presented wherein the capacitive elements are maintained in electrical contact with the conductors while avoiding the development of short circuits between the two bus bar conductors. Harper et al. 'fails to teach a structure for mounting large ceramic capacitors to a printed circuit board in which the capacitors may be easily removed in case of failure.

The subject invention, in contrast, is specifically directed to provision of a high power, high temperature disassemblable capacitor mount which permits high power ceramic capacitors to be mounted to a printed circuit board. As such, the subject invention must address problems associated with mechanical mounting of large capacitors, thermal expansion and cooling. Specifically, the subject invention provides for the capacitors to be removable from the bus bars to thereby allow the capacitors to be replaced in case of failure. Compressible, electrically conductive contactors are provided to permit the capacitors to thermally expand during operation, while maintaining electrical contact with the electrodes on the capacitors. Harper et al. '843 fails to teach the structure and the purposes of the subject invention.

U.S. Pat. No. 4,451,694 ("'694"), which issued on May 29, 1984 to Harper et al., is directed to various structures for, and methods of constructing, miniaturized high capacitance bus bars. The bus bars incorporate discrete high capacitive elements between a pair of bus bar conductors. In a preferred embodiment presented in this continuation-in-part of Harper et al. '843, a zebra film comprised of an elastomeric material having alternating strips of conducting and non-conducting material is positioned between the capacitive elements and the bus bar conductors. This zebra structure establishes electrical contact between the capacitive elements while avoiding the development of short circuits between the two bus bar conductors. This zebra structure may also have a mechanical force or means applied whereby the applicable conductive surfaces are urged into electrical contact with the elastomeric strip material.

The subject invention is directed to a disassemblable capacitor mount for high power, thermally expansive capacitors. Accordingly, the subject invention must provide a capacitor mount which is able to take significant thermal stress. Harper et al. '694, does not teach a structure which is able to take significant thermal stress. Further, Harper et al. '694, does not show a structure which allows cooling to take place between spaced-apart capacitors. Finally, the subject invention provides a high power electrical contact for the capacitors. Harper et al., '694, specifically directed to a low power capacitor mounting arrangement.

U.S. Pat. No. 4,517,406, which issued on May 14, 1985 to Erdle, is directed to one or more multi-layer ceramic capacitors positioned in a laminated bus bar so that a pair of opposed, external electrodes on each capacitor is positioned in substantially coplanar arrangement with the confronting plane surfaces of adjacent conductor strips in the bar. The two external electrodes of each capacitor are connected each to a different one of two spaced metal termination plates, which are mounted on each capacitor to interconnect its alternate and intervening electrodes, respectively. The two termination plates of each capacitor register with the spaced recesses or openings formed in each of the adjacent conductor strips to accommodate any projections on the termination plates and thereby permit coplanar engagement of the external electrodes with the conductor strips.

Again, the subject invention is directed to removable mounting and fixturing of high power ceramic capacitors. Erdle is not directed to and, accordingly, Erdle fails to teach the structure of the subject invention. Erdle specifically fails to teach a stress alleviating structure for mounting capacitors which allows capacitors to readily removed and replaced.

U.S. Pat. No. 4,599,486, which issued on July 8, 1986 to Herrandez, is directed to a miniaturized surface mountable bus bar wherein a sheet of insulating material is laminated between a pair of bus conductors and windows are provided in the laminated structure. A plurality of multi layer ceramic capacitor elements is inserted in the windows and alternate conductive side plates of the capacitors are electrically connected to the two bus conductors. The capacitors are comprised of alternating layers of conductive material and dielectric material and dielectric material having opposed terminating side conductors which are oriented parallel to the sheet of insulating material and the pair of bus conductors after assembly thereof.

The subject invention has structure which is substantially different from the structure taught in Herrandez. The structure in Herrandez is not directed to removable securing of large, high power ceramic capacitors to a printed circuit board and, therefore, fails to allow for thermal expansion and cooling of the capacitors and for easy removal and replacement of faulty capacitors.

DISCLOSURE OF INVENTION

The prior art has completely failed to address the problem of providing a means for mechanically and electrically mounting multiple large, high power, high temperature ceramic capacitors to a planar surface which allows for faulty capacitors to be readily removed and replaced.

Accordingly, it is the primary object of this invention to provide a disassemblable capacitor mount having in combination a plurality of rigid capacitors disposed between fixed, spaced-apart conductors. The capacitors have opposed electrode ends. The electrode ends are disposed within spaced-apart lateral slots on facing planar sides of the conductors. Thermal expansion-absorbing contacts are provided which include compressible, electrically conductive mechanisms for relieving stress disposed within the slots between the electrode ends and the planar sides of the conductors to provide a resilient biasing force between the electrode ends and the planar sides. The stress is caused by thermal expansion of the capacitors during operation. The slots space the capacitors apart to allow dissipation of heat in the capacitors generated during operation.

A further object of the invention is to provide a capacitor mount wherein conductors are fixed to a surface of a printed circuit board.

An alternative further object of the invention is to provide a capacitor mount wherein conductors are fixed to a surface of a chassis.

A still further object of the invention is to provide a capacitor mount wherein conductors are removable from a surface to permit replacement of capacitors.

Another object of the invention is to provide a capacitor mount wherein slots are of differing width to accommodate capacitors of differing thickness.

A still further object of the invention is to provide a capacitor mount wherein cooling for capacitors is provided between the spaced-apart capacitors.

Yet another object of the invention is to provide a capacitor mount wherein cooling is provided by a fluid.

In accordance with the above objects, a preferred embodiment of the subject invention provides a capacitor mount comprising a pair of substantially parallel, spaced-apart conductors, the conductors provided with a plurality of corresponding, spaced-apart lateral slots on facing planar sides thereof. A plurality of compressible contactors are disposed within the slots. A plurality of capacitors having opposed electrode ends are disposed between the conductors. The ends of the capacitors are positioned within the slots and contact the contactors. A rigid mechanism for removably fixing the conductors to a planar surface is provided to force the conductors to compressingly urge against the capacitors, the capacitor mount thereby providing a stress relieving, thermal expansion absorbing and heat dissipating structure for securing the capacitors to the planar surface.

The planar surface may be a surface of a printed circuit board. Alternatively, the planar surface may be a surface of a chassis. The conductors are removable from the planar surface to permit replacement of the capacitors. The slots may be of differing width to accommodate capacitors of differing thickness. Cooling for the capacitors is provided between the spaced-apart capacitors. The cooling may be provided by a fluid.

In the preferred embodiment, the capacitors are ceramic, the contactors are beryllium copper and the conductors are copper.

Other objects and advantages of the subject invention will be apparent upon reference to the accompanying description when taken in conjunction with the following drawings.

BEST MODE FOR CARRYING OUT INVENTION

Figure 1:
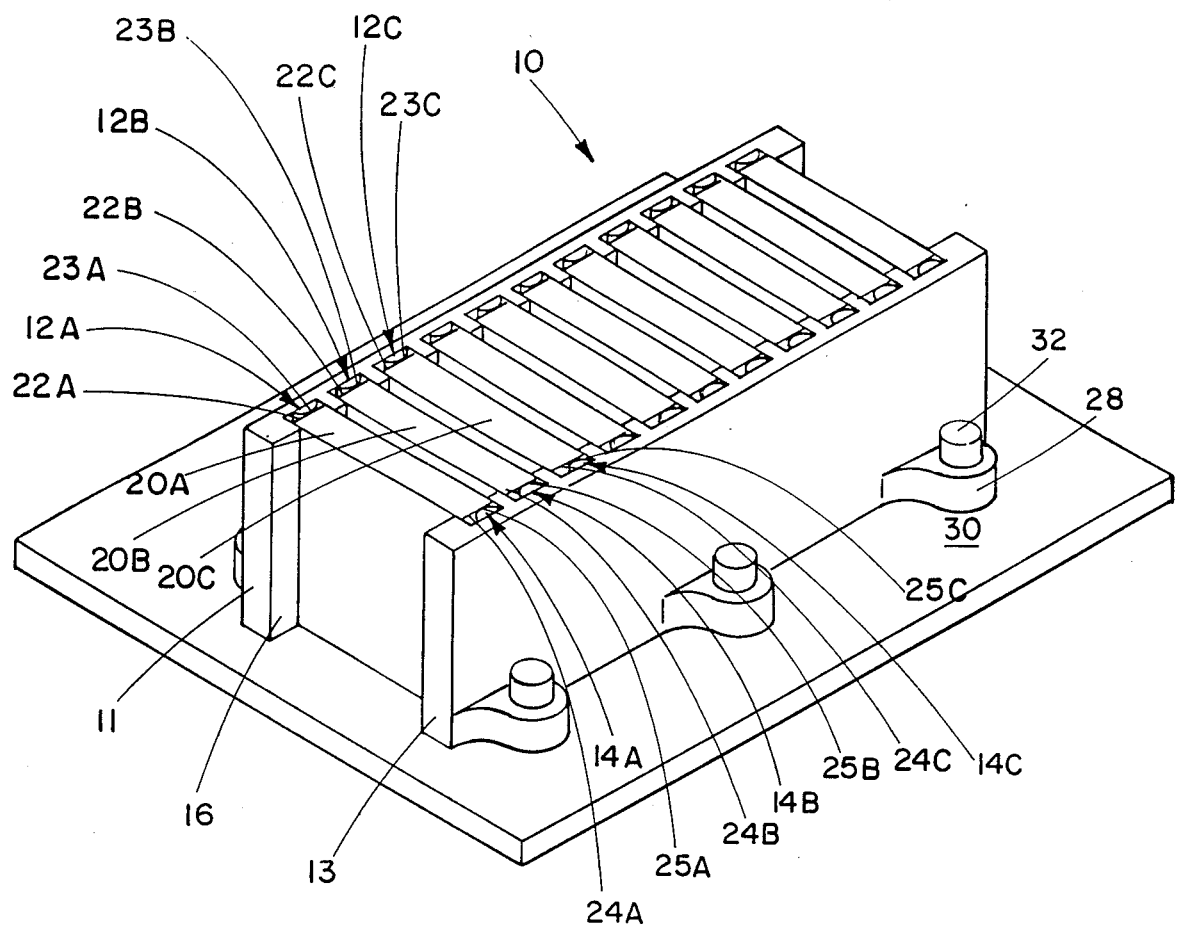
FIG. 1 is an isometric view of the high power, high temperature ceramic capacitor mount and its associated planar surface.

FIG. 1 shows an isometric view of the high power, high temperature ceramic capacitor mount, along with its associated planar surface.

The capacitor mount, indicated generally as 10, comprises a first bus bar 11 and a second bus bar 13. The first bus bar 11 and the second bus bar 13 are each constructed of conductive material and serve both as mechanical mounts for ceramic capacitors and as conductors for current leading to and from the capacitors. The first bus bar 11 and the second bus bar 13 are preferably of a rectangular cross section, although other forms are within the scope of the subject invention. As a minimal requirement, the first bus bar 11 and the second bus bar 13 should have substantially planar facing sides. The first bus bar 11 has a facing planar side 16, while the second bus bar 13 has a facing planar side (not shown). The first bus bar 11 and the second bus bar 13 are placed substantially in parallel with the planar sides facing one another.

A plurality of lateral slots 12A, 12B, 12C, among others not referenced, are located in the planar side 16 of the first bus bar 11. Likewise, lateral slots 14A, 14B, 14C, among others not referenced, are located in the planar side (not shown) of the second bus bar 13. The slots in the first bus bar 11 and the second bus bar 13 may be of differing size to accommodate different size capacitors. However, the slots in the first bus bar 11 must correspond to the slots in the second bus bar 13. Accordingly, slot 12A should correspond in width to slot 14A.

A plurality of capacitors 20A, 20B, 20C, among others not referenced, are shown disposed between and within the slots of the first bus bar 11 and the second bus bar 13. Capacitor 20A is shown disposed between and within slots 12A and 14A. Capacitors 20A, 20B, 20C are preferably ceramic capacitors, the internal construction of which will be described in greater detail below. Since all of the capacitors are of similar construction, reference will be made only to capacitor 20A by way of example. For purposes of FIG. 1, the ceramic capacitor 20A is coated with a dielectric substance and has a first electrode end 22A and a second electrode end 24A. (Corresponding first electrode ends 22B, 22C and second electrode ends 24B, 24C are also referenced. Other first and second electrode ends are shown but not referenced.)

A plurality of flexible, compressible contactors are located within the slots of the first bus bar 11 and the second bus bar 13. Specifically, contactors 23A, 23B, 23C, among others not referenced, are located within the slots 12A, 12B, 12C, respectively, in the first bus bar 11. Likewise, second contactors 25A, 25B, 25C, among others not referenced, are located with slots 14A, 14B, 14C of the second bus bar 13, as shown. In the preferred embodiment, these contactors 23A, 23B, 23C, 25A, 25B, 25C are made of beryllium copper and are bonded permanently to the first bus bar 11 and the second bus bar 13, respectively. The contactors 23A, 23B, 23C, 25A, 25B, 25C are allowed to flex within the slots 12A, 12B, 12C, 14A, 14B, 14C.

The first electrode end 22A of capacitor 20A is seated within slot 12A of the first bus bar 11. Accordingly, the first electrode end 22A, comes in electrical and mechanical contact with the first contactor 23A. Likewise, the second electrode 24A is seated within slot 14A of the second bus bar 13 and comes in contact with the second contactor 25A. Although the capacitor 20A is now in both mechanical and electrical contact with the first contactor 23A and the second contactor 25A, the capacitor 20A is not soldered thereto. By not soldering the contactors 23A, 25A to the capacitor 20A, the contactors 23A, 25A are allowed to move relative to the electrode ends 22A, 24A. Accordingly, thermal stress which is developed within the capacitor 20A during operation may be alleviated by this relative movement and the contactors 23A, 25A may be allowed to compress, thereby further alleviating thermal stress within the capacitor 20A.

During operation, the temperature of the capacitor 20A reaches high levels. Accordingly, the structure of the capacitor mount 10 is designed to flex, by virtue of the first and second contactors 23A, 25A, among others, being allowed to compress within the slots of the first and second bus bars 11, 13. Sufficient space is allowed between the capacitor 20A and the first and second bus bars 11 to permit appreciable thermal expansion of the capacitor 20A. Accordingly, the capacitor mount 10 can accommodate capacitors operating at high temperatures and handling high powers while allowing the capacitors to thermally expand with minimal stress. Conversely, as the capacitors cool down, the capacitor mount 10 allows the capacitors to contract by providing contactors which compressibly urge against the capacitors and expand when the capacitors contract. By providing flexible contactors within the slots of the bus bars, a need for the bus bars to shift relative to one another is eliminated.

A further advantage of the subject invention is that the contactors are not bonded to the capacitors. Accordingly, should a capacitor fail, it is a simple matter to separate the bus bars from the capacitors, thereby permitting removal and replacement of the faulty capacitor.

In the subject invention, the capacitor mount 10 is mounted on a planar surface 30, preferably a chassis wall or printed circuit board. For purposes of discussion, it will be assumed that the planar surface 30 is in fact a printed circuit board. The second bus bar 13 is fixed to the printed circuit board 30 by a plurality of studs 32 which pass through flanges 28 in the first bus bar 30. The studs 32 further pass through holes provided in the printed circuit board 30 and are attached thereto in a convention manner. Likewise, studs and flanges (neither shown nor referenced) are provided on the first bus bar 11 and likewise affix the first bus bar 11 to the printed circuit board 30. The studs 32 and the corresponding studs mounting the first bus bar 11 to the printed circuit board 30 are readily removable to allow the capacitors 20A, 20B, 20C, among others not referenced, to be replaced in the event of a fault. Electrical contact to either of the bus bars 11, 13 may be made an any point along the bus bars 11, 13 and may be made in any conventional manner.

Figure 2:
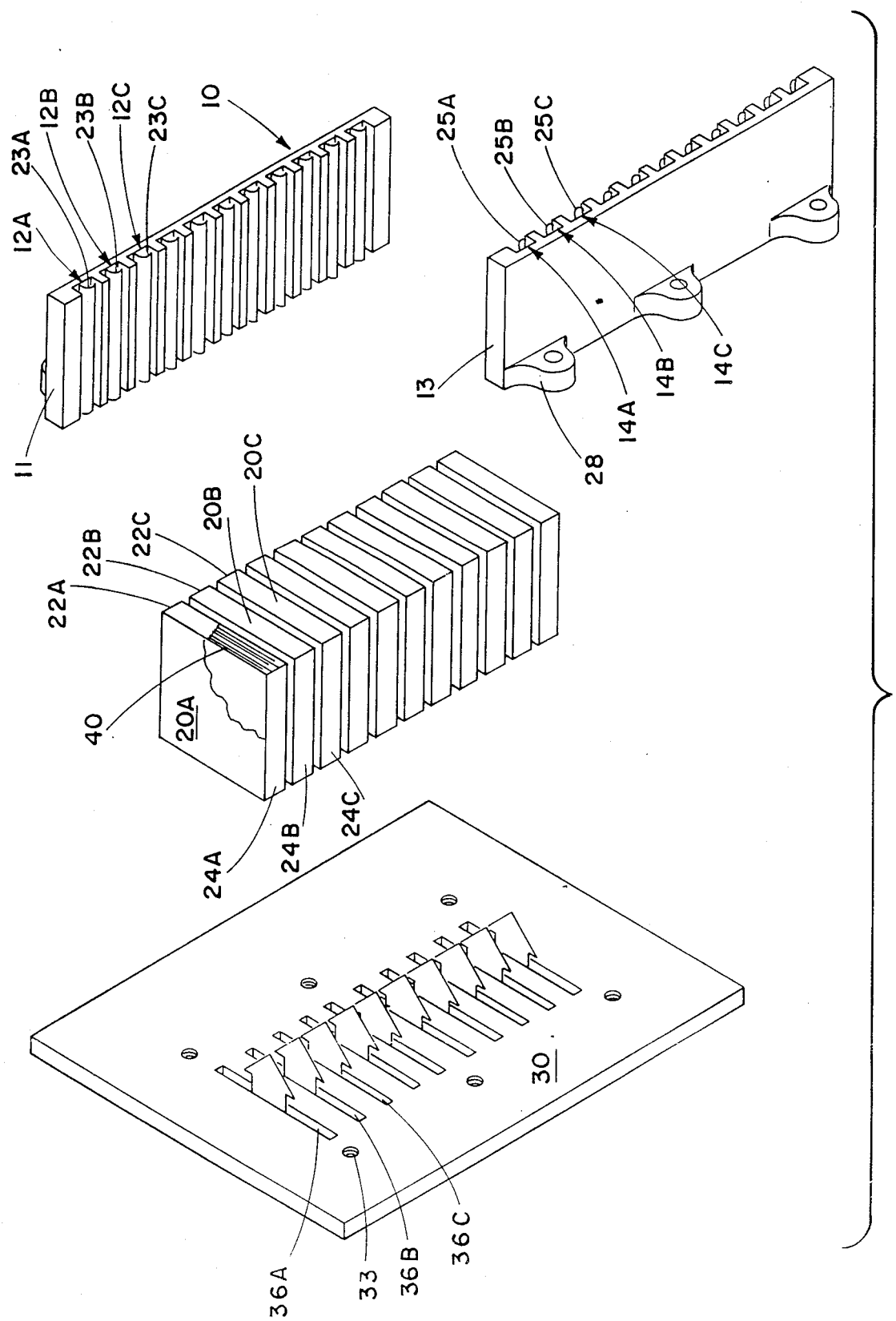
FIG. 2 is an exploded isometric view of the capacitor mount and printed circuit board of FIG. 1.

FIG. 2 shows an exploded isometric view of the capacitor mount and its associated printed circuit board shown in FIG. 1. Elements corresponding to those shown in FIG. 1 have like reference numerals and will not be described again. FIG. 2 shows objects which were hidden in FIG. 1 and allows a greater understanding of the structure of the capacitor mount 10.

FIG. 2 shows apertures 36A, 36B, 36C, among others not referenced. Hereinafter, only aperture 36A will be discussed, because apertures 36B, 36C and others not referenced function similarly. Aperture 36A is machined through the printed circuit board 30 to allow air or any other cooling fluid to flow through the aperture 36A and between the capacitors 20A and 20B during operation. A major feature of the subject invention is that the capacitors are held apart by the bus bars 11 and 13 to allow cooling to occur between the capacitors. The capacitors may be cooled by air or by direct immersion in some other fluid. Cooling can occur by convection or by forced flow.

Alternatively, the capacitors may be cooled by fluid flowing within tubes disposed between the capacitors 20A and 20B and extending through aperture 36A. In FIG. 2, air flow is represented by an unreferenced arrow emerging from aperture 36A.

Capacitor 20A is sectioned, allowing capacitor plates, indicated generally as 40, to be shown within the capacitor 20A. As shown, every other plate contacts the second electrode 24A. Alternating plates 40 which do not touch the second electrode 24A touch the first electrode 22A. Accordingly, an electric field (not shown) is created between the alternating plates 40 when a voltage is applied between the first electrode 22A and the second electrode 24A of capacitor 20A. In this way, the capacitor 20A functions to create capacitance.

Finally, a series of holes 33 is shown machined into the printed circuit board 30. The series of holes 33 is present to allow the studs 32 of FIG. 1 to pass through the printed circuit board 30, thereby allowing the first and second bus bars 11, 13 to be removably fixed to the printed circuit board 30.

Accordingly, the invention as described provides a means for removably securing large high power, high temperature ceramic capacitors to a printed circuit board or other planar surface which allows the capacitors to expand or contract, thereby alleviating thermal stress, provides spacing between the capacitors for cooling and provides a disassemblable means for mounting multiple ceramic capacitors in electrical parallel to handle high power in a small package suitable for airborne applications.

Although the subject invention has been illustrated and described in connected with a particular embodiment illustrated, it will be apparent to those skilled in the art that various changes maY be made therein without departing from the spirit of the invention as set forth in the appended claims.

I claim:

1. A disassemblable capacitor mount having in combination a plurality of rigid capacitors disposed between fixed, spaced-apart conductors, said capacitors having opposed electrode ends, said electrode ends disposed within spaced-apart lateral slots on facing planar sides of said conductors;

thermal expansion-absorbing contacts including compressible, electrically conductive means for relieving stress disposed within said slots between said electrode ends and said planar sides to provide a resilient biasing force against said electrode ends and said conductors, said stress caused by thermal expansion of said capacitors during operation, said slots spacing said capacitors apart to allow dissipation of heat in said capacitors generated during operation.

2. The capacitor mount as recited in claim 1 wherein said conductors are fixed to a surface of a printed circuit board.

3. The capacitor mount as recited in claim 2 wherein said conductors are removable from said surface to permit replacement of said capacitors.

4. The capacitor mount as recited in claim 3 wherein said slots are of differing width to accommodate capacitors of differing thickness.

5. The capacitor mount as recited in claim 4 wherein cooling for said capacitors is provided between said spaced-apart capacitors.

6. The capacitor mount as recited in claim 5 wherein said cooling is provided by a fluid.

7. The capacitor mount as recited in claim 1 wherein said conductors are fixed to a surface of a chassis.

8. A disassemblable capacitor mount, comprising:
   a pair of substantially parallel, spaced-apart conductors, said conductors provided with a plurality of corresponding, spaced-apart lateral slots on facing planar sides thereof;
   a plurality of compressible contactors disposed within said slots;
   a plurality of capacitors having opposed electrode ends, said capacitors disposed between said conductors, said ends positioned within said slots, said ends contacting said contactors; and
   rigid means for removablY fixing said conductors to a planar surface, said conductors compressingly urging against said capacitors, said capacitor mount thereby providing a stress relieving, thermal expansion absorbing and heat dissipating structure for securing said capacitors to said planar surface.

9. The capacitor mount as recited in claim 8 wherein said planar surface is a surface of a printed circuit board.

10. The capacitor mount as recited in claim 9 wherein said conductors are removable from said planar surface to permit replacement of said capacitors.

11. The capacitor mount as recited in claim 10 wherein said slots are of differing width to accommodate capacitors of differing thickness.

12. The capacitor mount as recited in claim 11 wherein said cooling for said capacitors is provided between said spaced-apart capacitors.

13. The capacitor mount as recited in claim 12 wherein said cooling is provided by a fluid.

14. The capacitor mount as recited in claim 13 wherein said capacitors are ceramic.

15. The capacitor mount as recited in claim 14 wherein said contactors are beryllium copper.

16. The capacitor mount as recited in claim 15 wherein said conductors are copper.

17. The capacitor mount as recited in claim 8 wherein said planar surface is a surface of a chassis.

* * * * *